United States Patent
Joffe et al.

(10) Patent No.: US 11,349,576 B2
(45) Date of Patent: *May 31, 2022

(54) SYSTEMS AND METHODS FOR COMMUNICATING HIGH SPEED SIGNALS IN A COMMUNICATION DEVICE

(71) Applicant: ADTRAN, Inc., Huntville, AL (US)

(72) Inventors: Daniel M. Joffe, Owens Crossroads, AL (US); Vern Brethour, Owens Crossroads, AL (US)

(73) Assignee: ADTRAN, Inc., Huntsville, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/167,879

(22) Filed: Feb. 4, 2021

(65) Prior Publication Data
US 2021/0159988 A1 May 27, 2021

Related U.S. Application Data

(63) Continuation-in-part of application No. 16/457,071, filed on Jun. 28, 2019, now Pat. No. 10,944,599.

(60) Provisional application No. 63/041,558, filed on Jun. 19, 2020.

(51) Int. Cl.
*H04B 10/80* (2013.01)
*H04B 10/40* (2013.01)

(52) U.S. Cl.
CPC .......... *H04B 10/802* (2013.01); *H04B 10/40* (2013.01)

(58) Field of Classification Search
CPC ......... G02B 6/4279; H03F 2203/45114; H03F 2203/45138; H03F 2203/45512; H03F 2203/45528; H03F 3/45475; H03H 11/1217; H03H 2011/0494; H04B 10/272;
(Continued)

(56) References Cited

U.S. PATENT DOCUMENTS

| | | | |
|---|---|---|---|
| 5,955,918 A * | 9/1999 | Uno | H03F 3/087 330/9 |
| 10,171,051 B2 * | 1/2019 | Oku | H03F 3/08 |
| 10,944,599 B2 * | 3/2021 | Joffe | G02B 6/4279 |

(Continued)

FOREIGN PATENT DOCUMENTS

JP 2011244093 A * 12/2011 ............... H03F 3/08

OTHER PUBLICATIONS

Casas et al; Fully differential AC-Coupling Networks: A comparative Study; Jan. 2009; IEEE; pp. 1-5. (Year: 2009).*

*Primary Examiner* — Amritbir K Sandhu
(74) *Attorney, Agent, or Firm* — Maynard Cooper & Gale, P. C.; Brian T. Sattizahn

(57) ABSTRACT

A coupling module can be used to communicate high speed signals between an optical transceiver and a processing module of an optical communication device, such as an optical line termination (OLT) or an optical network unit (ONU). The coupling module can adjust the common mode voltage level of a differential signal output by the optical transceiver to the common mode voltage level required by the processing module. In addition, the coupling module splits each of the differential output signals from the optical transceiver and passes the split signals to both a high-pass filter and a low-pass filter that are connected in parallel. An adapter module can be connected to the coupling module such that the coupling module can receive different differential signals from different optical transceivers.

20 Claims, 13 Drawing Sheets

(58) Field of Classification Search
CPC ... H04B 10/40; H04B 10/802; H04L 25/0272; H04L 25/0276
USPC .......................................................... 398/136
See application file for complete search history.

(56) References Cited

U.S. PATENT DOCUMENTS

| | | | | |
|---|---|---|---|---|
| 2003/0043066 | A1* | 3/2003 | Otsuka | H03M 1/363 |
| | | | | 341/158 |
| 2010/0277215 | A1* | 11/2010 | Tam | H03F 3/45304 |
| | | | | 327/333 |
| 2011/0236027 | A1* | 9/2011 | Nosaka | H03F 3/45475 |
| | | | | 398/135 |
| 2013/0258312 | A1* | 10/2013 | Lewis | G01S 7/4865 |
| | | | | 356/4.01 |
| 2013/0300455 | A1* | 11/2013 | Thirugnanam | H03K 19/018514 |
| | | | | 326/82 |
| 2017/0131730 | A1* | 5/2017 | Joffe | G05F 5/00 |
| 2020/0412584 | A1* | 12/2020 | Joffe | H04L 25/0276 |

* cited by examiner

SYSTEMS AND METHODS FOR COMMUNICATING HIGH SPEED SIGNALS IN A COMMUNICATION DEVICE

CROSS-REFERENCE TO RELATED APPLICATIONS

This application claims the benefit of U.S. Provisional Patent Application No. 63/041,558, entitled "SYSTEMS AND METHODS FOR COMMUNICATING HIGH SPEED SIGNALS IN A COMMUNICATION DEVICE" and filed on Jun. 19, 2020, which is incorporated herein by reference. This application is a continuation-in-part of U.S. patent application Ser. No. 16/457,071, entitled "SYSTEMS AND METHODS FOR COMMUNICATING HIGH SPEED SIGNALS IN A COMMUNICATION DEVICE" and filed on Jun. 28, 2019, which is incorporated herein by reference.

BACKGROUND

The present application generally relates to systems and methods for communicating high speed signals between a transceiver and a processing module in a communication device, such as an optical line termination.

In an optical line termination, an optical transceiver receives an optical signal modulated with a data stream from an optical network unit and converts the optical signal to an electrical signal. The electrical signal from the optical transceiver is provided to a processing module for further processing as may be desired. Frequently, the optical transceiver and the processing module are provided in separate circuits (possibly in separate cards or separate integrated circuits) having different common mode voltage level or DC (direct current) offset voltage level requirements. For example, the optical transceiver can output a signal having a common mode voltage (e.g., 3.3 V) that is significantly greater than the common mode voltage (e.g., 1.2 V or 0.6 V) for the signal that can be received by the processing module. Thus, the electrical signal from the optical transceiver cannot be provided directly to the processing module because the processing module is not equipped to handle the signal with the higher common mode voltage.

For compatibility between the optical transceiver and the processing module, the common mode voltage for the signal from the optical transceiver should be level shifted so that the signal can be received by the processing module. One way to couple the optical transceiver to the processing module is with a resistor divider. A drawback to using a resistor divider is a reduction in the amplitude of the signal. Another way to couple the optical transceiver to the processing module to obtain the desired level shift is with capacitive coupling. One drawback to capacitive coupling is that the coupling capacitors do not provide an appropriate DC response and may not function properly if burst mode operation is required in the optical line termination. Another way to couple the optical transceiver to the processing module to obtain the desired level shift is with bus transceivers. A drawback to the use of bus transceivers is that they undesirably introduce jitter into the signal. All of the previously described ways of coupling the optical transceiver to the processing module also have a drawback in that they are designed for use with a single type of optical transceiver and would not provide an appropriate common mode voltage to the processing module if coupled to a different type of optical transceiver.

SUMMARY

The present application generally pertains to a coupling module in a communication device, such as an optical line termination (OLT) or optical network unit (ON U), that communicates high speed signals, i.e., signals transmitted at 1 Gbps (Gigabit per second) or greater, between a transceiver and a processing module. The coupling module can provide the common mode voltage level desired by the processing module substantially independent of the common mode voltage level of the signal output by the transceiver.

The coupling module can receive a differential signal from the transceiver and split each of the positive signal and the negative signal that form the differential signal for additional processing. The split signals for both the positive differential signal path and the negative differential signal path can then be provided to a high-pass filter and a low-pass filter that are connected in parallel. For example, the positive differential signal can be split into two signals with one being provided to a high-pass filter and the other being provided to a low-pass filter. In an embodiment, the low-pass filter can have an inverting configuration such that the output from the low-pass filter is inverted with respect to the input. The outputs of the high-pass filters from the differential signal paths are cross-coupled to the outputs of the low-pass filters of the other differential signal paths to correct for the inversion of the signal from the low-pass filter. For example, the output of the high-pass filter connected in the positive differential signal path is connected to the output of the low-pass filter connected in the negative differential signal path. The cross-coupled signals are then combined to form a differential signal that is provided to the processing module. In another embodiment, the low-pass filter can have a non-inverting configuration such that the output from the low-pass filter is not inverted with respect to the input. The outputs of the high-pass filters from the differential signal paths are coupled to the outputs of the low-pass filters of the same differential signal paths. For example, the output of the high-pass filter connected in the positive differential signal path is connected to the output of the low-pass filter connected in the positive differential signal path. The signals from the high-pass filter and the low-pass filter of each differential signal path are then combined to form a differential signal that is provided to the processing module.

The high-pass filter and the low-pass filter can be configured such that one or more predetermined ranges of frequencies of the signal from the transceiver are provided to the processing module without any significant phase shift. In addition, the low-pass filters can be configured to provide the common mode voltage required by the processing module for a range of input common mode voltages provided by the transceiver. To accomplish the level shift of the common mode voltage from the transceiver, the common mode voltage outputs of the low-pass filters can be measured by a feedback circuit that then provides an appropriate input to the low-pass filters such that the common mode voltage output from the low-pass filters is at the appropriate level for the processing module.

One advantage of the present application is the jitter-free communication of high speed signals between an optical transceiver and a processing module in an optical communication device.

Another advantage of the present application is that the coupling module can simultaneously provide DC coupling, signal integrity, and wide (GHz to multi-GHz) bandwidth while maintaining signal amplitude.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 1:
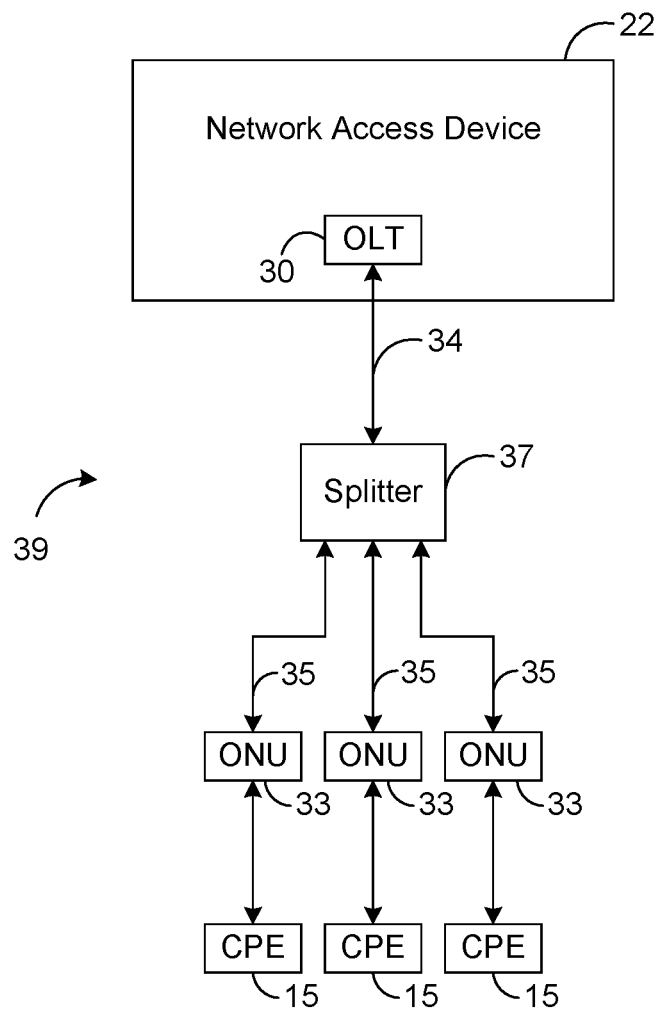
FIG. 1 is a block diagram showing an embodiment of a passive optical network.

The present application generally pertains to a coupling module connecting an optical transceiver and a processing module in an optical communication device, such as an optical line termination (OLT) or optical network unit (ONU). The coupling module can include a coupling network that connects a driver circuit of the optical transceiver providing a differential signal to a receiver circuit of the processing module receiving a differential signal. In one embodiment, the coupling network can include a purely passive high-pass filter in parallel with an op-amp (operational amplifier) based low-pass filter for both the positive path and the negative path of the differential signal. The high-pass filters can include a capacitor to reduce jitter. In one embodiment, the low-pass filter can incorporate an op-amp configured in an inverting mode and have a resistor and a capacitor connected in parallel at the output of the op-amp. In addition, the low-pass filter can be used to control the common mode voltage of the differential signal provided to the processing module. A feedback circuit can be coupled to receive the outputs of the op-amps of the low-pass filters and provide an input voltage to the op-amps so that the outputs of the op-amps have a common mode voltage expected by the receiver of the processing module. The feedback circuit can include an op-amp that receives the output common mode voltages from the op-amps of the low-pass filters and a reference voltage that corresponds to the expected common mode voltage for the receiver of the processing module as inputs. The output of the low-pass filter on one path of the differential signal can be cross-coupled to the output of the high-pass filter on the other path of the differential signal with a linking circuit. In another embodiment, output of the high-pass filter on one path of the differential signal can be cross-coupled to the output of the low-pass filter on the other path of the differential signal with a linking circuit. The cross-coupling of the outputs from the high-pass filters and the low-pass filters can compensate for the operation of the op-amps of the low-pass filters in the inverting mode. In a further embodiment, the low-pass filter can incorporate an op-amp configured in a non-inverting mode and the outputs of the high-pass filter and the low-pass filter for each path of the differential signal can be coupled with a linking circuit.

The high-pass filter and the low-pass filter can be tuned to preserve the signals in a transition region between the two filters (i.e., a region where the outputs of the filters overlap). However, in other embodiments, there can be gap in the transition region between the high-pass filter and the low-pass filter. The gap in the transition region between the filters can be predefined by tuning both the high-pass filter and the low-pass filter such that the parameters (e.g., width) of the gap are known. In a further embodiment, one or both of the high-pass filter and the low-pass filter may not be tuned and may result in a gap in the transition region.

FIG. 1 depicts an embodiment of a passive optical network (PON) 39 for communicating data with customer premises equipment (CPE) 15. Examples of PONs and telecommunication systems that can be used with the present application are described in commonly-assigned U.S. Pat. No. 9,729,241, entitled "Telecommunication Systems and Methods Using Dynamic Shaping for Allocating Network Bandwidth" and granted on Aug. 8, 2017, which is incorporated herein by reference.

As shown by FIG. 1, the PON 39 includes an optical line termination (OLT) 30. In one embodiment, the OLT 30 resides on a line card of a network access device (NAD) 22, which may include other OLTs of other PONs, as is described by U.S. Pat. No. 9,729,241. The NAD 22 can be used to facilitate communications, both upstream and downstream, between the CPEs 15 and a telecommunication network (not shown). As an example, the network access device 22 may reside at a central office of a telecommunication network or an intermediate point between a central office and the CPEs 15.

The OLT 30 can be coupled to an optical splitter 37 by an optical fiber 34, and the optical splitter 37 is configured to split a signal from the OLT 30 across multiple optical fibers 35 that are respectively coupled to ONUs 33 as shown. Each ONU 33 can receive at least one packet flow from the OLT 30 and convert the received packet flow(s) from the optical domain to the electrical domain. The OLT 30 and the optical components coupled to it, including the optical splitter 37, ONUs 33, and optical fibers 34, 35 form the PON 39. In one embodiment, the PON 39 is a gigabit passive optical network (GPON), but other types of PONs are possible in other embodiments.

Figure 2:
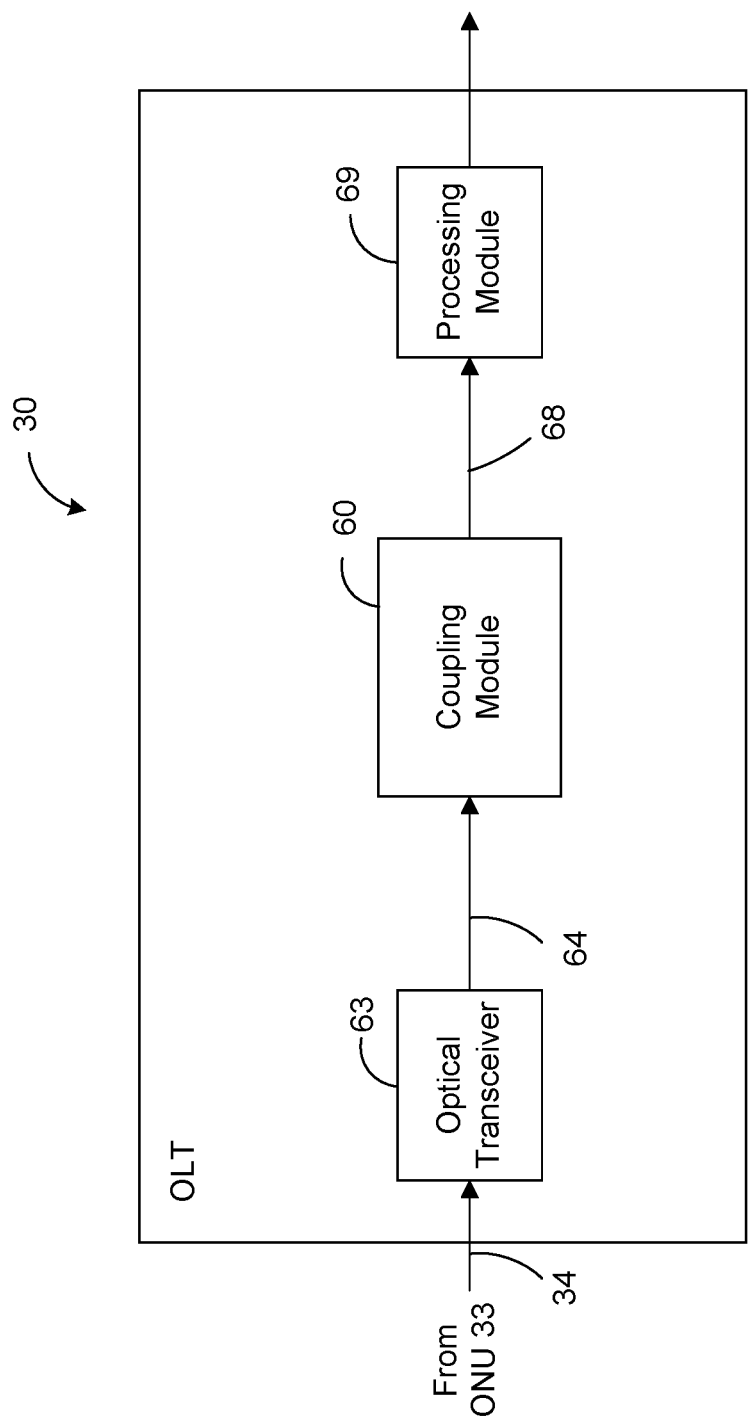
FIG. 2 is a block diagram showing various components of an embodiment of an optical line termination.

FIG. 2 shows an embodiment of an OLT 30 with the components used for processing upstream communications from an ONU 33. It is to be understood that the OLT 30 shown in FIG. 2 may include additional equipment and/or components to perform additional functions and operations that are not shown in FIG. 2, e.g., the processing of downstream communications. The OLT 30 can have an optical transceiver 63 that receives an upstream optical signal from an ONU 33 via optical fiber 34. The signal carries a data stream transmitted by the ONU 33. In one embodiment, the signal from the ONU 33 can be a high speed signal carrying the data stream at a data rate of between about 1 Gbps and about 10 Gbps or greater, though other data rates are possible. The optical transceiver 63 converts the received optical signal to an electrical signal and provides the electrical signal to an input connection 64 of the coupling module 60 as a differential pair of signals. The coupling module 60 adjusts the level of the common mode voltage or DC offset voltage of the electrical signal and provides an electrical signal with an adjusted common mode voltage as a differential pair of signals to a processing module 69 via output connection 68. Note that in one embodiment all of the components of the OLT 30 can reside on a printed circuit board (PCB), referred to as a "line card." In other embodiments, other configurations of the OLT 30 are possible.

The optical transceiver 63 can include a photo detector, such as an avalanche photo diode, to convert the optical signal to an electrical signal. The optical transceiver 63 can also include an amplifier circuit such as a trans-impedance amplifier and a driver circuit to provide the electrical signal to the input connection 64 of the coupling module 60. In addition, the optical transceiver 63 can be configured to be either DC coupled or AC (alternating current) coupled. The AC-coupled optical transceiver 63 includes a capacitor connected between the driver circuit and an output connection that is coupled to the input connection 64 of the coupling module 60. The common mode voltage of the electrical signal from the optical transceiver 63 can range between about 2.5 V and about 3.3 V, although other voltage ranges are possible in other embodiments.

The processing module 69 can include a receiver circuit to receive the signal from an output connection 68 of the coupling module 60. The processing module 69 can also include a field programmable gate array (FPGA) and/or other electrical components to further process the received signal. In one embodiment, the common mode voltage of the electrical signal provided on the output connection 68 from the coupling module 60 can be less than about 1.3 V to correspond to the desired common mode voltage of the processing module 69. In another embodiment, the required common mode voltage of the processing module 69 can be about 0.6 V, though other common mode voltages are possible. The coupling module 60 can shift or adjust the level of the common mode voltage of the differential pair of signals provided at input connection 64 such that the common mode voltage level of the differential pair of signals provided at the output connection 68 is acceptable for the processing module 69.

Figure 3:
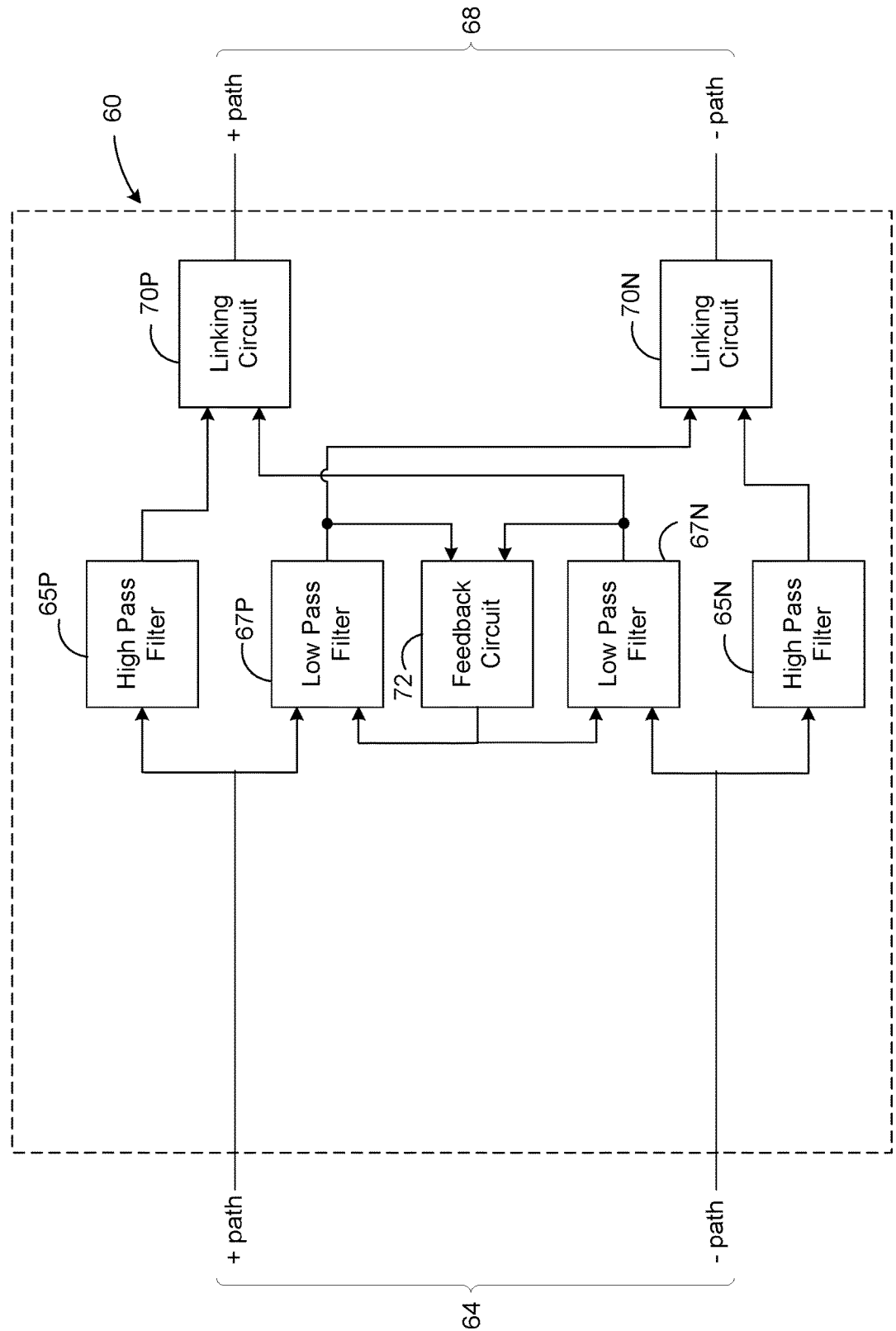
FIG. 3 is a block diagram showing various components of an embodiment of the coupling module of FIG. 2.
Figure 4:
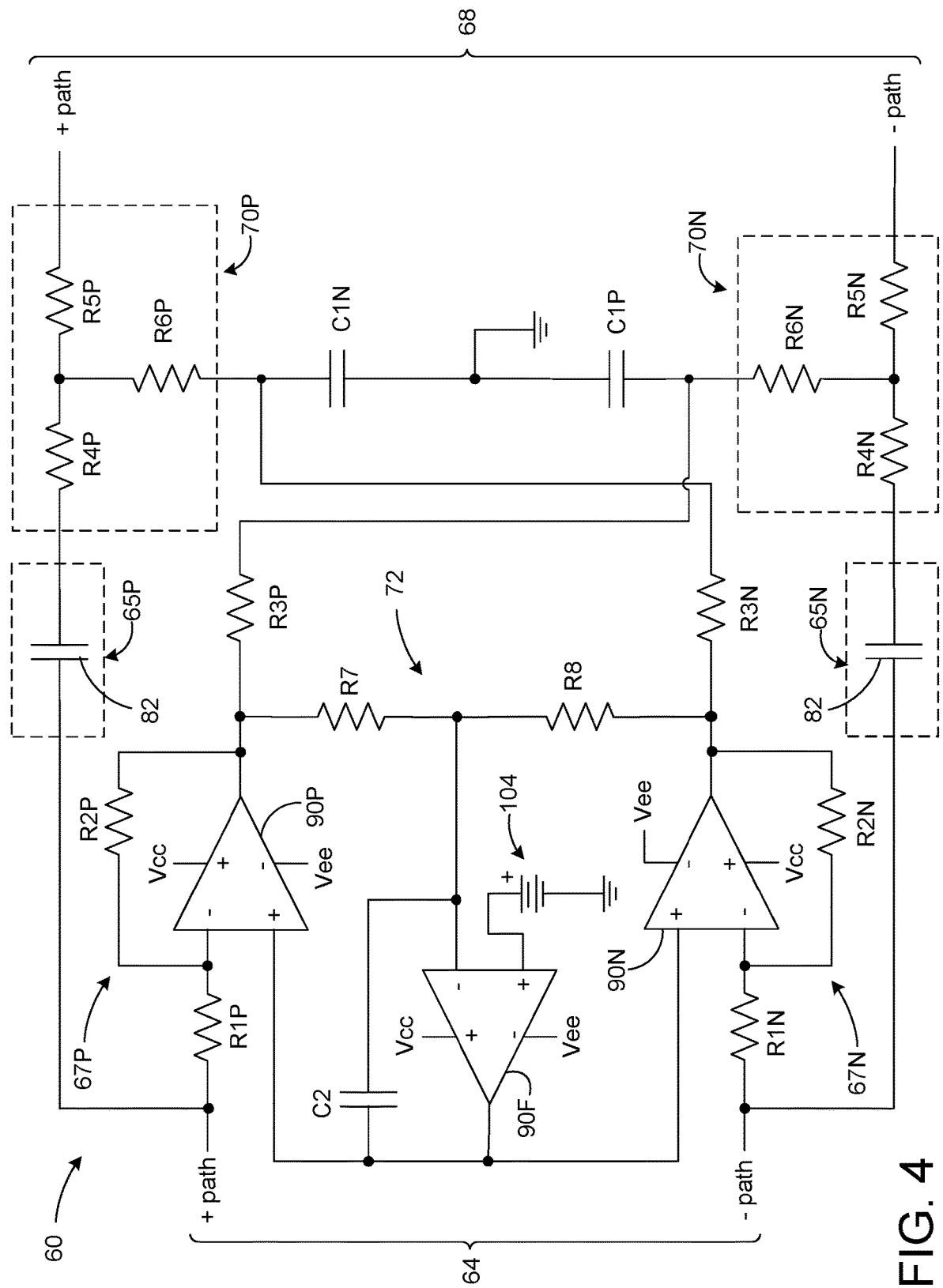
FIG. 4 is a circuit diagram showing an embodiment of the coupling module of FIG. 3.

As shown in FIGS. 3 and 4, the coupling module 60 can receive from the transceiver 63 a positive differential signal at a positive or non-inverting path (+ path) and a negative differential signal at a negative, inverting or complementary path (− path) of the input connection 64. Similarly, the coupling module 60 can provide a differential signal (e.g., a positive differential signal and a negative differential signal that is inverted with respect to the positive differential signal) for the processing module 69 at a positive or non-inverting path (+ path) and a negative, inverting or complementary path (− path) of the output connection 68. The coupling module 60 can adjust the level of the common mode voltage of the input differential signal at the input connection 64 such that the output differential signal provided by the coupling module 60 at the output connection 68 corresponds to the common mode voltage expected by the processing module 69.

The coupling module 60 can provide the input positive differential signal on the positive path (+ path) to both a high-pass filter 65P and a low-pass filter 67P connected in parallel. Similarly, the coupling module 60 can provide the input negative differential signal on the negative path (− path) to both a high-pass filter 65N and a low-pass filter 67N connected in parallel. The input negative differential signal can be an inversion of the input positive differential signal in one embodiment. The coupling module 60 can include a linking circuit 70P to combine the outputs of the high-pass filter 65P and the low-pass filter 67N to form the output positive differential signal provided on the positive path (+ path) of output connection 68 and a linking circuit 70N to combine the outputs of the high-pass filter 65N and the low-pass filter 67P to form the output negative differential signal provided on the negative path (− path) of output connection 68. The output negative differential signal can be an inversion of the output positive differential signal in one embodiment.

The high-pass filters 65P, 65N filter the low frequency signals from the input differential signals and permit the high frequency signals above a predetermined frequency from the input differential signals to pass to the corresponding linking circuits 70P, 70N and then the output connection 68. The low-pass filters 67P, 67N filter the high frequency signals from the input differential signals and permit the low frequency signals below a predetermined frequency to pass to cross-coupled linking circuits 70P, 70N and then the output connection 68. In addition, the low-pass filters 67P, 67N also shift or adjust the level of the common mode voltage of the input differential signals based on feedback from feedback circuit 72 such that the common mode voltage level of the output differential signals at the output connection 68 is acceptable for the processing module 69.

As shown in FIG. 4, the high-pass filters 65P, 65N can each include a capacitor 82 to filter out the low frequency signals in the input differential signals from the optical transceiver 63 and permit the high frequency signals above a predetermined frequency in the input differential signals from the optical transceiver 63 to pass to the corresponding linking circuits 70P, 70N and then the output connection 68. In one embodiment, the capacitor 82 can have a capacitance of about 0.1 μF. In another embodiment, the capacitor 82 can have a capacitance of about 0.01 μF. However, capacitor 82 may use different capacitances in still other embodiments.

The low-pass filters 67P, 67N include operational amplifiers (op-amps) 90P, 90N operated in the inverting mode (i.e., the input signal is connected to the inverting node of the op-amp). The op-amps 90P, 90N are used to control the level of the common mode voltage of the output differential signal provided at the output connection 68 since the capacitors 82 of the high-pass filters 65P, 65N block the common mode voltage received from the optical transceiver 63. In one embodiment, the op-amps 90P, 90N can include a Texas Instruments OPA2830 providing sufficient bandwidth and a low noise figure. However, other op-amps having different bandwidths and noise figures may be used in other embodiments.

The input positive differential signal from the positive path (+ path) passes through resistor R1P and is received at the inverting input of op-amp 90P. Similarly, the input negative differential signal from the negative path (− path) passes through resistor R1N and is received at the inverting input of op-amp 90N. The non-inverting inputs of the op-amps 90P, 90N can be biased at a fixed voltage within the common mode range of the op-amps 90P, 90N as described below. In addition, feedback signals from the outputs of the op-amps 90P, 90N can pass through corresponding resistors R2P, R2N and be provided at the inverting inputs of the op-amps 90P, 90N. In one embodiment, a predetermined ratio for R2P/R1P and R2N/R1N can be used to generate a flat frequency response from the op-amps 90P, 90N. In an embodiment, resistors R1P and R1N can each have a resistance of about 5 kΩ and resistors R2P and R2N can each have a resistance of about 23 kΩ. However, in other embodiments, other resistances may be used for resistors R1P, R1N, R2P and R2N.

The low-pass filters 67P, 67N can also include capacitors C1P, C1N and resistors R3P, R3N connected to the output of the op-amps 90P, 90N. The corresponding capacitors C1P, C1N and resistors R3P, R3N can be configured to filter out the high frequency signals in the differential signals received at the input connection 64 and permit the low frequency signals in the differential signals received at the input connection 64 to pass to the output connection 68. The resistors R3P, R3N can be connected in series with the corresponding outputs of the op-amps 90P, 90N and the capacitors C1P, C1N can be connected in parallel with the resistors R3P, R3N. The capacitors C1P, C1N and resistors R3P, R3N can be configured to provide a predetermined low frequency response such that when combined with the predetermined high frequency response of the high-pass filters 65P, 65N, the predetermined high frequency response and the predetermined low frequency response are tuned to provide the output connection 68 with all the frequencies of the differential signals received at the input connection 64 without any substantial phase shift in the signals. In one embodiment, the capacitors C1P, C1N can have a capacitance of about 0.1 µF and the resistors R3P, R3N can have a resistance between about 28Ω and about 40Ω, but the capacitors C1P, C1N and resistors R3P, R3N may have different values in other embodiments.

Since the input differential signals are provided to the inverting input of the op-amps 90P, 90N (i.e., the op-amps 90P, 90N are operated in an inverting configuration), the output signals from the op-amps 90P, 90N are inverted with respect to the input differential signals. In order to compensate for the inversion of the signal by the op-amps 90P, 90N, the outputs of the op-amps 90P, 90N are cross-coupled to the outputs of high-pass filters 65P, 65N such that positive differential signals from the high-pass filter 65P are combined with positive differential signals from op-amp 90N (which inverted the negative differential signal received at the inverting input to op-amp 90N) and negative differential signals from the high-pass filter 65N are combined with negative differential signals from op-amp 90P (which inverted the positive differential signal received at the inverting input to op-amp 90P).

FIG. 4 also shows the linking circuits 70P, 70N connecting the output of the high-pass filter 65P and the output of the low-pass filter 67N to the positive path (+ path) of the output connection 68 and the output of the high-pass filter 65N and the output of the low-pass filter 67P to the negative path (− path) of the output connection 68. The linking circuits 70P, 70N can be used to establish the gain of the high pass paths through the high-pass filters 65P, 65N. The gain of the cross-coupled low pass paths through the low-pass filters 67N, 67P can be matched to the gain of the high pass paths through the high-pass filters 65P, 65N using the ratio of resistors R1P, R1N and resistors R2P, R2N. In one embodiment, the resistors R1P, R1N and resistors R2P, R2N can be selected to provide a 50Ω impedance from either the high-pass filters 65P, 65N or the input connection 64. In another embodiment, the linking circuits 70P, 70N can include resistors R4P, R4N connected in series with the output of the high-pass filters 65P, 65N, resistors R5P, R5N connected in series between resistors R4P, R4N and the positive and negative paths of the output connection 68, and resistors R6P, R6N connected to the output of the low-pass filters 67N, 67P and in parallel between resistors R4P, R4N and resistors R3N, R3P. In one embodiment, resistors R4P, R4N and resistors R5P, R5N can each have a resistance between about 3Ω and about 9Ω and resistors R6P, R6N can have a resistance between about 140Ω and about 433Ω. However, other resistances may be used for resistors R4P, R4N, R5P, R5N, R6P and R6N in other embodiments. In another embodiment, the linking circuits 70P, 70N can also operate as a 50Ω constant impedance, 3 dB attenuator to attenuate any reflections that may occur between the optical transceiver 63 and the processing module 69. While the linking circuits 70P, 70N have been shown in a "T" configuration in FIG. 4, the linking circuits 70P, 70N may have other configurations in other embodiments.

A feedback circuit 72 can sense the output common mode voltage from the op-amps 90P, 90N, compare the sensed output common mode voltage to a reference voltage corresponding to the desired common mode voltage for the processing module 69, and provide a signal back to the op-amps 90P, 90N to adjust the common mode voltage at the output of the op-amps 90P, 90N. The common mode voltage outputs from the op-amps 90P, 90N can be summed and provided to a feedback circuit 72 that can provide an input to non-inverting inputs of the op-amps 90P, 90N such that the common mode voltage provided at the output of the op-amps 90P, 90N is at an acceptable level for the processing module 69. The feedback circuit 72 permits the op-amps 90P, 90N to provide the acceptable common mode voltage for the processing module 69 for a wide range of input common mode voltages received from the transceiver 63 at the input connection 64.

The feedback circuit 72 can include a resistor R7 connected to the output of op-amp 90P and a resistor R8 connected to the output of op-amp 90N. The resistors R7 and R8 are also connected to the inverting input of an op-amp 90F. The non-inverting input of the op-amp 90F can be connected to a voltage source 104 that can provide an input voltage that corresponds to the acceptable voltage for the processing module 69. In another embodiment, the voltage source 104 can be replaced with a connection to the processing module 69 that permits the processing module 69 to provide an input voltage to the non-inverting input of op-amp 90F that is substantially equal to the acceptable common mode voltage of the processing module 69. A capacitor C2 can be connected between the inverting input to the op-amp 90F and the output of the op-amp 90F. In one embodiment, the capacitor C2 can have a capacitance of about 100 pF and the resistors R7 and R8 can have a resistance of about 10 kΩ, but the capacitor C2 and resistors R7 and R8 may have different values in other embodiments. In addition, the output of the op-amp 90F is provided to the non-inverting inputs of the op-amps 90P, 90N and can be used to automatically set the common mode output voltage from the op-amps 90P, 90N.

In one embodiment, the feedback circuit 72 (i.e., resistors R7 and R8, the op-amp 90F and the capacitor C2) can be configured as an integrator having an input that is the difference between the reference voltage from the voltage source 104 (which corresponds to the desired or acceptable common mode voltage for the processing module 69) and the common mode voltage output voltage output from op-amps 90P, 90N. The op-amp 90F can then provide a voltage at the non-inverting inputs of op-amps 90P, 90N that results in a common mode voltage output from the op-amps 90P, 90N that is equal to the reference voltage. The output voltage from the op-amp 90F can be compatible with the operation of the op-amps 90P, 90N. In other words, the output voltage level from the op-amp 90F is not close to the supply voltage level for the op-amps 90P, 90N. In one embodiment, the output voltage from the op-amp 90F can range between about 224 mV and about 2.29 V. The feedback circuit 72 can provide the appropriate voltages to the non-inverting inputs of the op-amps 90P, 90N to generate the desired common mode voltage output from the op-amps 90P, 90N for substantially all common mode voltages (e.g., 0 to 3.3 V) and impedances (e.g., between 0 (if an inductor is present) to infinity (if a capacitor is present) at DC) at the optical transceiver 63.

The op-amps 90P, 90N, 90F can receive "dual-rail" supply voltages of Vcc and Vee. In one embodiment, Vcc can be about 3.3 V and Vee can be about −3.3 V and the coupling module 60 shown in FIG. 4 can have about 3 dB of insertion loss. In another embodiment, the supply voltages can be increased and Vcc can be about 5 V and Vee can be about −5 V and the coupling module 60 shown in FIG. 4 can have about 1 dB of insertion loss.

Figure 5:
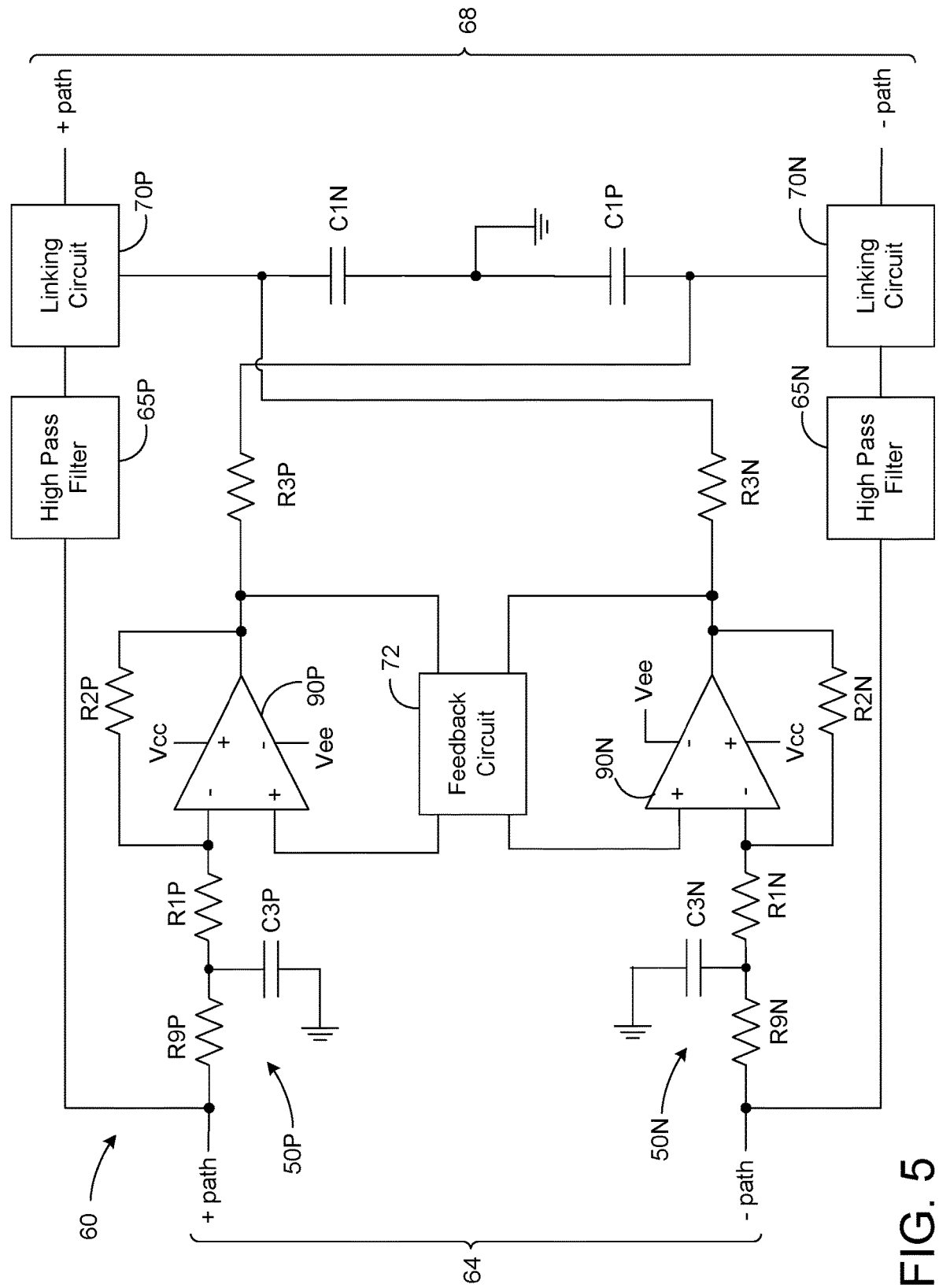
FIG. 5 is a circuit diagram showing another embodiment of the coupling module of FIG. 3.
Figure 6:
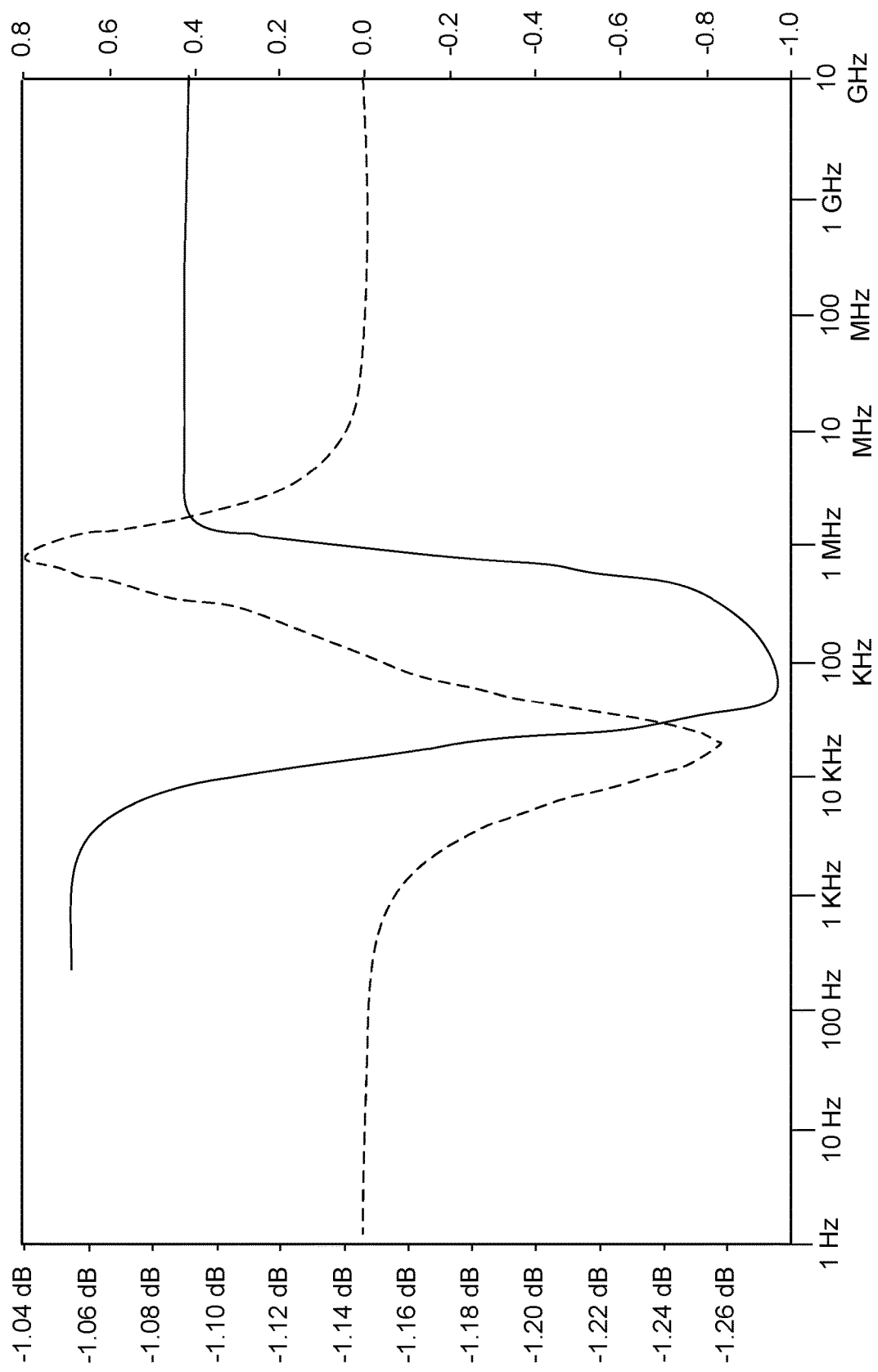
FIG. 6 is a graph showing an exemplary frequency response from the coupling module of FIG. 5.

FIG. 5 shows an embodiment of a coupling module 60 similar to the embodiment of the coupling module 60 shown in FIG. 4. However, the coupling module 60 of FIG. 5 also includes low-pass filter circuits 50P, 50N connected between the positive and negative paths of the input connection 64 and the resistors R1P, R1N of the low-pass filters 67P, 67N. The low-pass filter circuits 50P, 50N can be used to prevent the op-amps 90P, 90N of the low-pass filters 67P, 67N from receiving (and having to process) higher frequency signals, which higher frequency signals may affect the operating points of the op-amps 90P, 90N. In one embodiment, the low-pass filter circuits 50P, 50N can be configured to provide an input pole below about 1 MHz, though other frequencies are possible. The low-pass filter circuits 50P, 50N can include resistors R9P, R9N connected in series with resistors R1P, R1N, and capacitors C3P, C3N connected in parallel between resistors R9P, R9N and resistors R1P, R1N. In one embodiment, the capacitors C3P, C3N can have a capacitance of about 100 pF and the resistors R9P, R9N can have a resistance between about 2 kΩ, but the capacitors C3P, C3N and resistors R9P, R9N may have different values in other embodiments. FIG. 6 shows an embodiment of the frequency response from the coupling module 60 of FIG. 5 with the solid curve showing the amplitude response and the dashed curve showing the phase response. As shown in FIG. 6, the disturbance in the frequency response is less than about 0.22 dB total.

Figure 7:
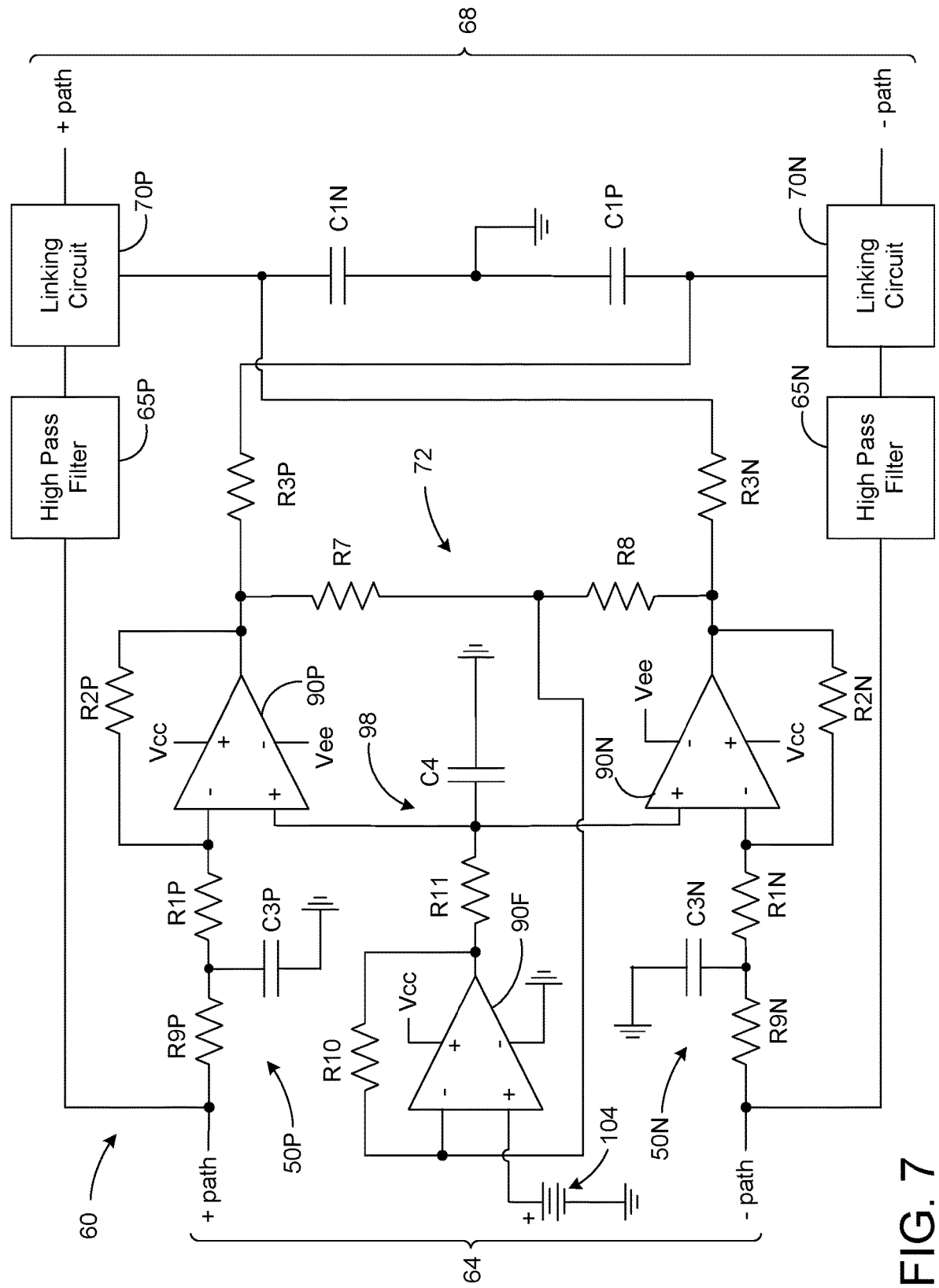
FIG. 7 is a circuit diagram showing a further embodiment of the coupling module of FIG. 3.

FIG. 7 shows an embodiment of a coupling module 60 similar to the embodiment of the coupling module 60 shown in FIG. 5. However, the coupling module 60 of FIG. 7 has a different feedback circuit 72 to provide inputs to the low-pass filter circuits 67P, 67N. The feedback circuit 72 can include a resistor R7 connected to the output of op-amp 90P and a resistor R8 connected to the output of op-amp 90N. The resistors R7 and R8 are also connected to the inverting input of an op-amp 90F. The non-inverting input of the op-amp 90F can be connected to a voltage source 104 that can provide an input voltage that corresponds to the acceptable voltage for the processing module 69. In another embodiment, the voltage source 104 can be replaced with a connection to the processing module 69 that permits the processing module 69 to provide an input voltage to the non-inverting input of op-amp 90F that is substantially equal to the acceptable common mode voltage of the processing module 69. A resistor R10 can be connected between the inverting input to the op-amp 90F and the output of the op-amp 90F. In one embodiment, the resistor R10 can have a resistance of about 221 kΩ and the resistors R7 and R8 can have a resistance of about 5.6 kΩ, but the resistors R7, R8 and R10 may have different values in other embodiments.

In addition, the output of the op-amp 90F is provided to the non-inverting inputs of the op-amps 90P, 90N after being provided to a stabilization circuit 98 to prevent oscillations from the outputs of op-amps 90P, 90N. The output of the op-amp 90F can be used to automatically set the common mode output voltage from the op-amps 90P, 90N. In one embodiment, the stabilization circuit 98 can include a resistor R11 connected in series between the output of the op-amp 90F and the non-inverting inputs of the op-amps 90P, 90N. A capacitor C4 can be connected between resistor R11 and ground. In one embodiment, the capacitor C4 can have a capacitance of about 100 nF and the resistor R11 can have a resistance of about 22.1 kΩ, but the capacitor C4 and resistor R11 may have different values in other embodiments.

Figure 11:
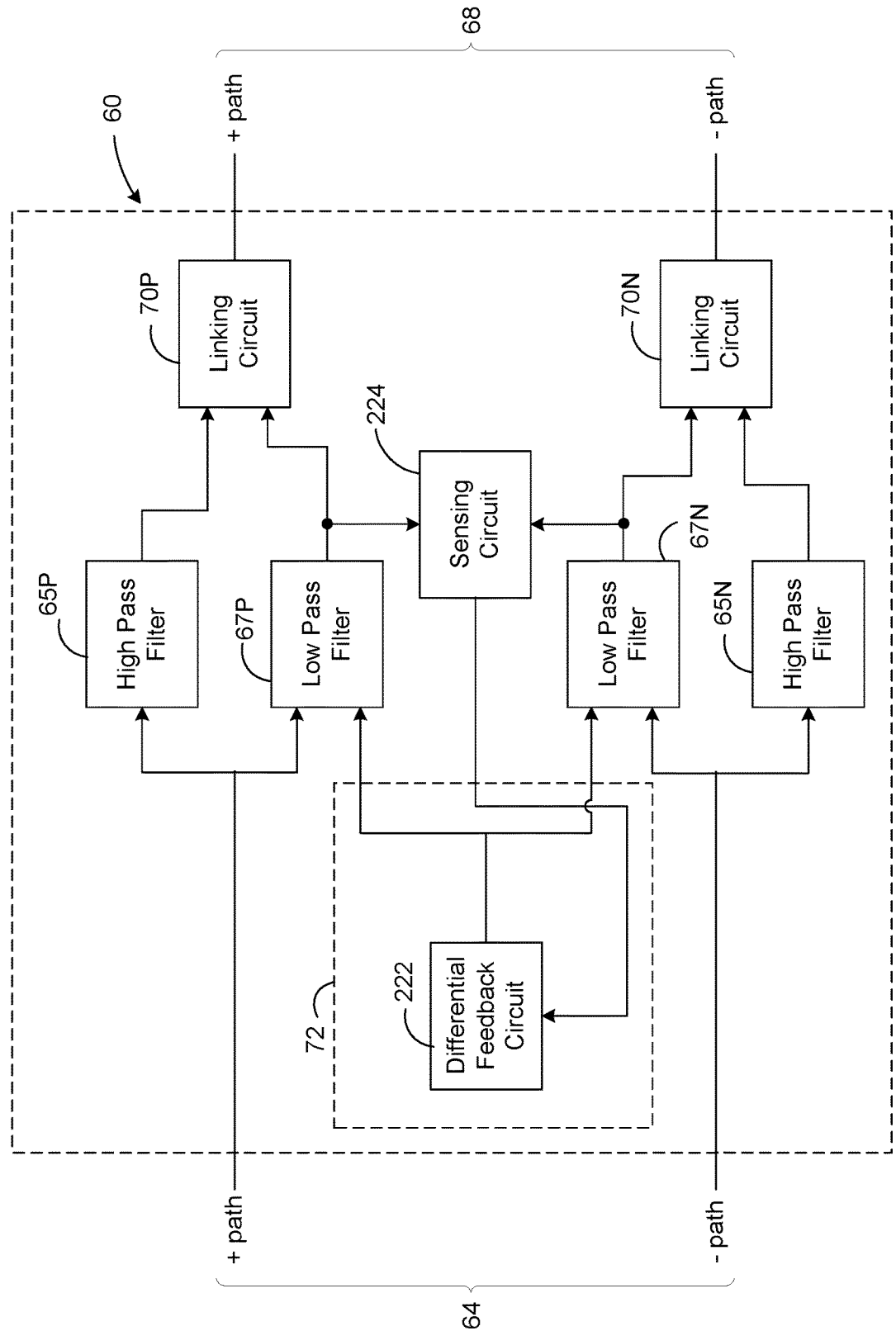
FIG. 11 is a block diagram showing another embodiment of the coupling module of FIG. 2.

FIG. 11 shows another embodiment of the coupling module 60 of FIG. 2. In the embodiment of FIG. 11, the low-pass filters 67P, 67N of the coupling module 60 can include operational amplifiers (op-amps) operated in the non-inverting mode (i.e., the input signal is connected to the non-inverting node of the op-amp). In addition, the output of the low-pass filter 67P of the coupling module 60 of FIG. 11 can be coupled to linking circuit 70P and the output of the low-pass filter 67N of the coupling module 60 of FIG. 11 can be coupled to linking circuit 70N. The non-inverting op-amps of the low-pass filters 67P, 67N can be used to control the level of the common mode voltage of the output differential signal provided at the output connection 68. Examples of low-pass filters with op-amps operating in the non-inverting mode that can be used with the present application are described in commonly-assigned U.S. Pat. No. 9,891,638, entitled "Systems and Methods for Communicating High Speed Signals in a Communication Device" and granted on Feb. 13, 2018, which is incorporated herein by reference.

The coupling module 60 can use the feedback circuit 72 to provide an input signal (or voltage) to the low pass filters 67P, 67N. The feedback circuit 72 can include a differential feedback circuit 222 to receive and process the output common mode voltage from the low pass filters 67P, 67N sensed by sensing circuit 224, compare the sensed output common mode voltage to a reference voltage corresponding to the desired common mode voltage for the processing module 69, and provide a signal back to the low pass filters 67P, 67N to adjust the common mode voltage at the output of the low pass filters 67P, 67N. In one embodiment, the sensing circuit 224 can sense the common mode voltage output from the low pass filters 67P, 67N with a summing network that adds the common mode voltage provided by each of the low pass filters 67P, 67N. As shown in FIG. 11, the output of the differential feedback circuit 222 can be split in order to be provided to both of the low pass modules 67P, 67N.

Figure 8:
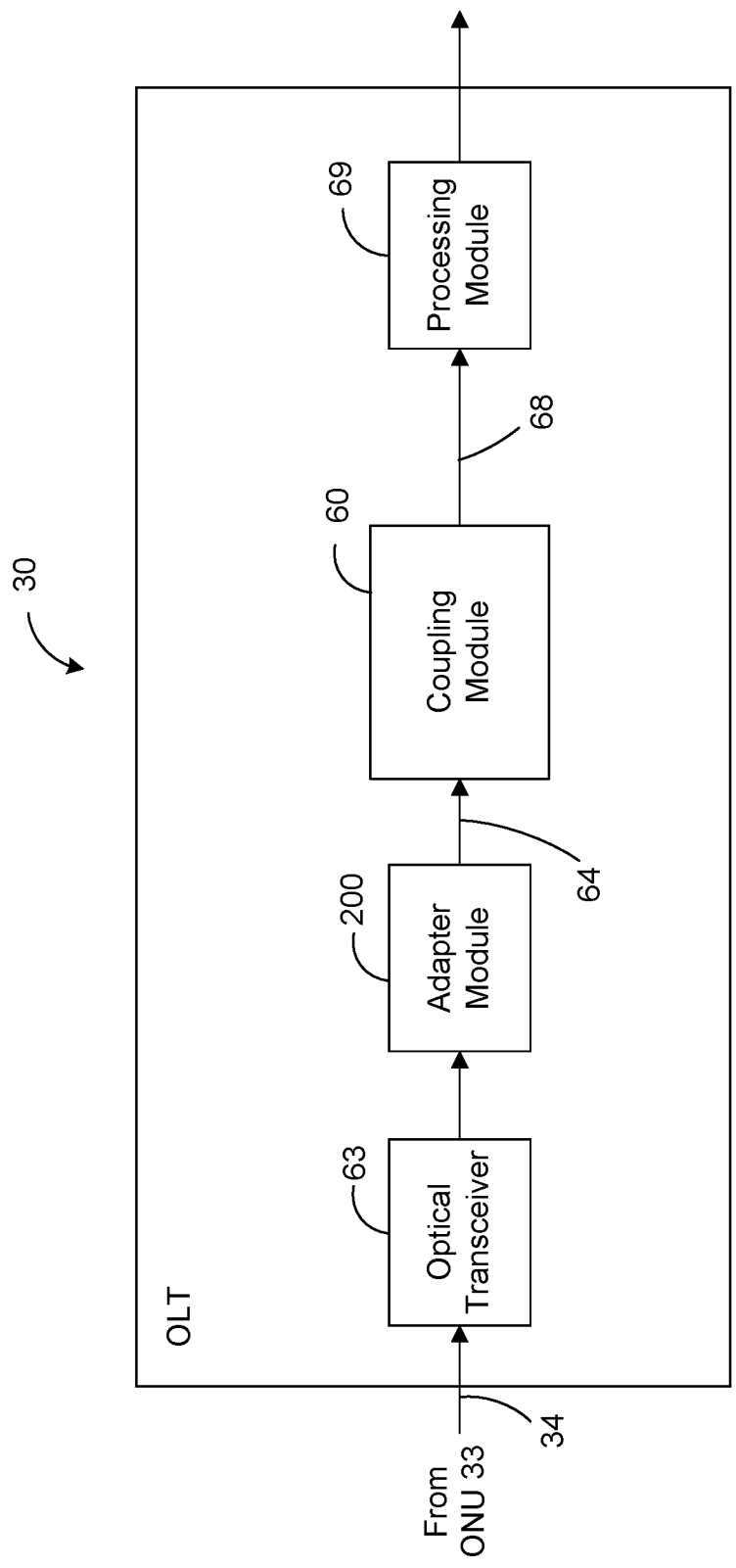
FIG. 8 is a block diagram showing various components of another embodiment of an optical line termination.

FIG. 8 shows an embodiment of an optical line termination 30 similar to the embodiment of the optical line termination 30 shown in FIG. 2. However, the optical line termination 30 of FIG. 8 includes an adapter module 200 to permit the coupling module 60 to work with different types and/or configurations of optical transceivers 63. In one embodiment, the coupling module 60 can have any suitable configuration that adjusts the level of the common mode voltage or DC offset voltage of the electrical signal received via input connection 64 from the adapter module 200 and provides an electrical signal with an adjusted common mode voltage as a differential pair of signals to a processing module 69 via output connection 68. In an embodiment, the optical transceiver 63 can have a CML (current-mode logic) driver configuration or an LVPECL (low voltage positive emitter coupled logic) or LVPCL driver configuration each of which has different output requirements. For example, the LVPECL driver has an emitter/follower configuration with different current requirements than the CML driver, which does not have an emitter/follower. The adapter module 200 is configured to provide appropriate voltage levels and current paths for the different outputs from the optical transceiver 63 such that the coupling module 60 receives an appropriate input at input connection 64.

Figure 9A:
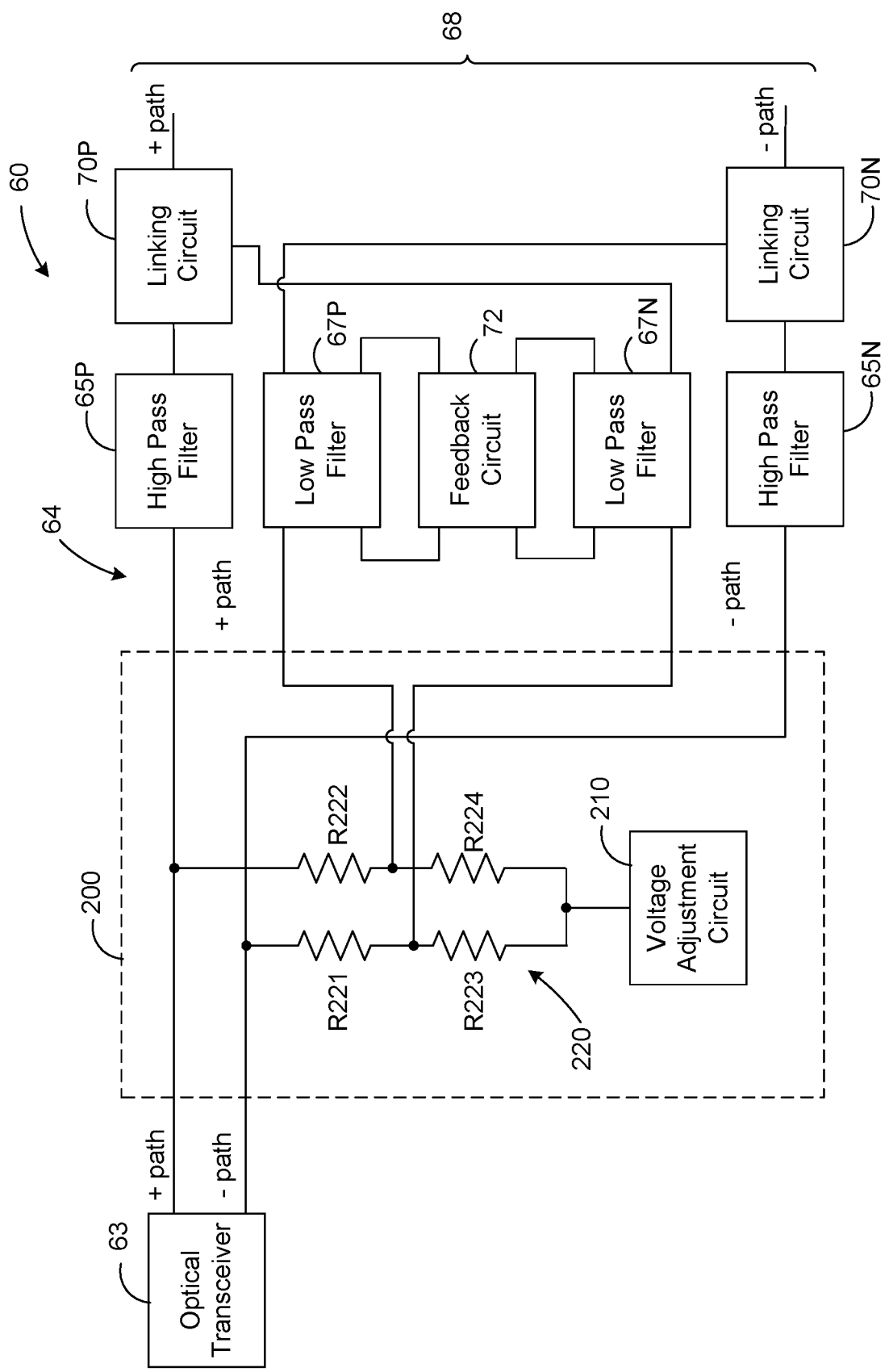
FIGS. 9A and 9B are block diagrams showing various components of various embodiments of the adapter module and the coupling module of FIG. 8.
Figure 9B:
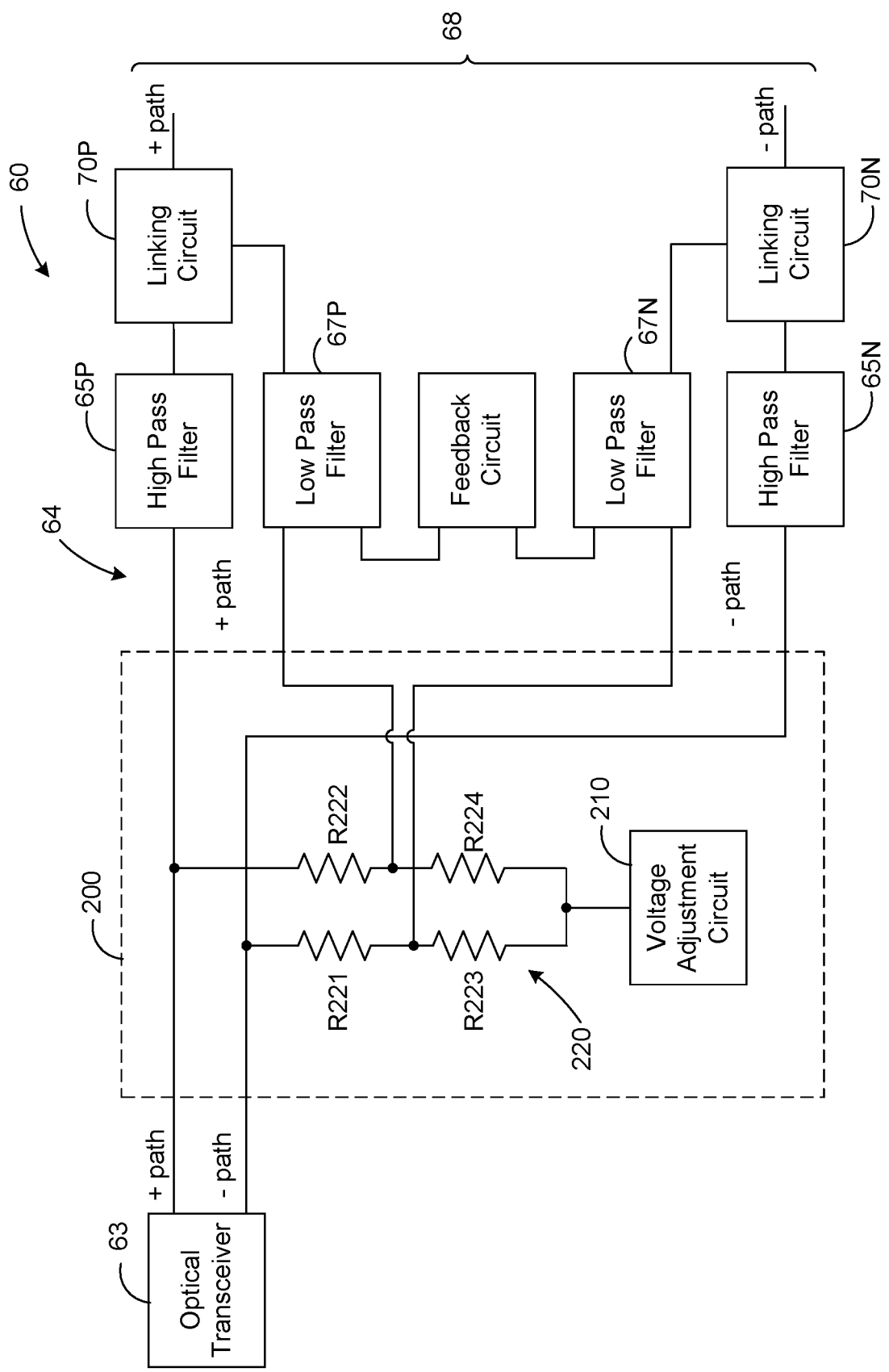

As shown in FIGS. 9A and 9B, the adapter module 200 can receive a differential signal (e.g., a positive path and a negative path) from the optical transceiver 63 and provide a corresponding differential signal to the input connection 64 for the coupling module 60. In the embodiment shown in FIG. 9A, the coupling module 60 can be configured as described above with regard to FIG. 4, 5 or 7. In the embodiment shown in FIG. 9B, the coupling module 60 can be configured as described above with regard to FIG. 11 or as described in U.S. Pat. No. 9,891,638, entitled "Systems and Methods for Communicating High Speed Signals in a Communication Device" and granted on Feb. 13, 2018, which patent is incorporated herein by reference. The differential signal provided to the coupling module 60 at input connection 64 by the adapter module 200 can be a "spilt" differential signal. The split differential signal can include two separate positive paths (i.e., one positive path for the high pass filter 65P and one positive path for the low pass filter 67P) and two separate negative paths (i.e., one negative path for the high pass filter 65N and one negative path for the low pass filter 67N). Specifically, the signals provided by the adapter module 200 to the high pass filters 65P, 65N is the differential signal from the optical module 63. The signals provided by the adapter module 200 to the low pass filters 67P, 67N is the differential signal from the optical module 63 after passing through a portion of a resistor divider 220. The resistor divider 220 can be coupled between the differential signal from the optical transceiver 63 and a voltage source, such as (1) a voltage adjustment circuit 210 that establishes a predetermined voltage (e.g., ground or a preselected voltage greater than 0 V) at the end of the resistor divider 220 opposite the differential signal from the optical transceiver 63 or (2) a fixed voltage source that provides a fixed voltage, as will be described in more detail below.

The resistor divider 220 can include a pair of series-connected resistors R221, R223 connected to the negative path of the differential signal from the optical transceiver 63 and a pair of series-connected resistors R222, R224 connected to the positive path of the differential signal from the optical transceiver 63. In one embodiment, the resistors R221, R222, R223 and R224 can each have a resistance of about 50Ω, but the resistors R221, R222, R223 and R224 may have different values (either individually or as a group) in other embodiments. The two pairs of resistors can then be coupled together and connected to the voltage adjustment circuit 210. The corresponding portion of the differential signal provided to the low pass filters 67P, 67N can be provided from a connection between resistors R221 and R223 (for the negative path) and a connection between resistors R222 and R224 (for the positive path). The portion of the differential signal provided to the low pas filters 67P, 67N can include information associated with the DC level of the differential signal from the optical transceiver 63.

Figure 10A:
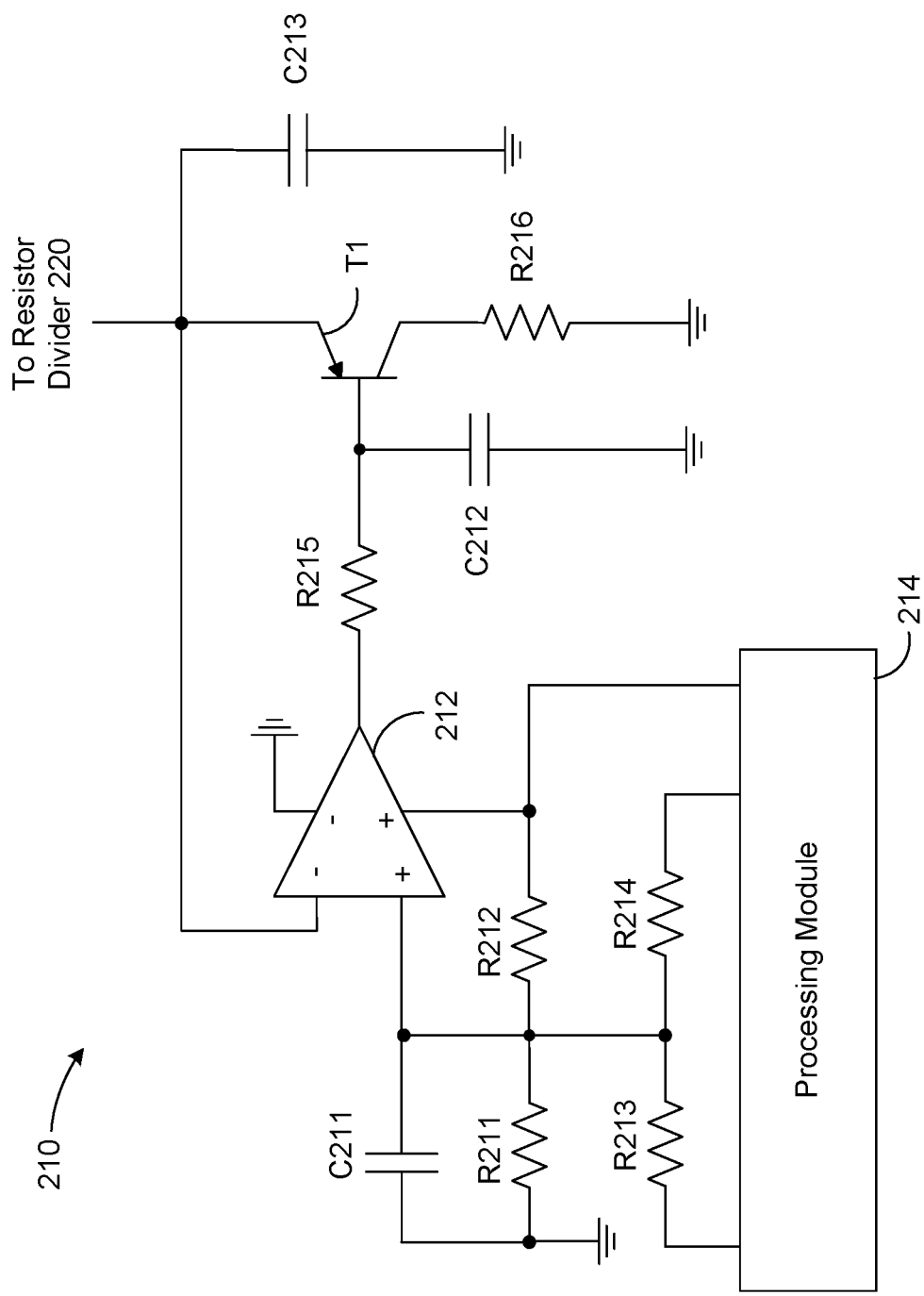
FIGS. 10A and 10B are circuit diagrams showing different embodiments of the voltage module of FIG. 9.

FIG. 10A is a circuit diagram showing an embodiment of the voltage adjustment circuit 210 to control the voltage level provided at the end of the resistor divider 220 opposite the connection to the differential signal from the optical transceiver 63. The voltage adjustment circuit 210 can include a transistor T1 controlled by an op-amp 212 that sets the voltage level that is pulled to by the resistor divider 220. The emitter of transistor T1 can be connected to the resistor divider 220, the collector of transistor T1 can be connected to resistor R216 and the base of transistor T1 can be connected to the output of op-amp 212 through series resistor R215. In one embodiment, the transistor T1 can be a BJT (bipolar junction transistor), but the transistor T1 may be any suitable type of transistor in other embodiments. In one embodiment, a capacitor C213 and the non-inverting input to the op-amp 212 can be connected to the resistor divider 220 in parallel with the emitter of transistor T1. However, in another embodiment, capacitor C213 may be omitted. A capacitor C212 can be connected between the base of transistor T1 and ground. In one embodiment, capacitor C212 can have a capacitance of about 27 pF, capacitor C213 can have a capacitance of about 100 nF, the resistor R215 can have a resistance of about 1 kΩ and the resistor R216 can have a resistance of about 10Ω, but capacitors C212 and C213 and resistors R215 and R216 may have different values in other embodiments.

The non-inverting input to the op-amp 212 can be connected to a resistor network receiving control inputs (e.g., voltage inputs (or bits)) from a processing module 214. The processing module 214 can include a field programmable gate array (FPGA) and/or other electrical components to provide the corresponding voltage inputs to the resistor network. The resistor network can provide an input voltage to the non-inverting input of the op-amp 212 based on the control (e.g., voltage) inputs provided by the processing module 214. The processing module 214 can provide control (e.g., voltage) inputs to the resistor network based on the type of optical receiver 63 being used. The resistor network can include a capacitor C211 connected between the non-inverting input of op-amp 212 and ground, a resistor R211 connected in parallel with capacitor C211, a resistor R212 connected between the non-inverting input of op-amp 212 and power supplied to the op-amp 212 by the processing module 214, and a pair of series-connected resistors R213 and R214 connected between the non-inverting input of op-amp 212 and separate control terminals on processing module 214. Resistors R212, R213 and R214 can be connected to different terminals of the processing module 214 to receive different control (e.g., voltage) inputs from the processing module 214. For example, resistor R213 can be connected to a first control input of the processing module 214. The first control input may be set "high" (e.g., 3.3 V) such that the voltage level pulled to by the resistor divider 220 is "high" when the optical transceiver 63 includes a CML driver. In contrast, the first control input may be set "low" (e.g., 0 V) such that the voltage level pulled to by the resistor divider 220 is "low" when the optical transceiver 63 includes a LVPCL driver. In addition, resistor R214 can be connected to a second control input of the processing module 214. The second control input may be set "high" (e.g., 3.3 V) or "low" (e.g., 0 V) depending on one or more of the first control input, the driver of the optical transceiver 63 (e.g., CML or LVPCL) and the desired voltage to be pulled by the resistor divider 220. In one embodiment, the capacitor C211 can have a capacitance of about 1 nF, the resistor R211 can have a resistance of about 10 kΩ, the resistor R212 can have a resistance of about 13 kΩ, the resistor R213 can have a resistance of about 100 kΩ, and the resistor R214 can have a resistance of about 49.9 kΩ, but the capacitor C211 and resistors R211, R212, R213 and R214 may have different values in other embodiments.

In an embodiment, the output of the op-amp 212 can be used to control the transistor T1 such that the current from the resistor divider 220 flows to capacitor 213 or flows through transistor T1 to resistor R216 and ground. In another embodiment, the voltage adjustment circuit 210 can be replaced by a fixed voltage source that provides a fixed voltage to the end of the resistor divider 220 opposite the connection to the differential signal from the optical transceiver 63. The fixed voltage from the fixed voltage source can be selected to permit the coupling module 60 to operate with several different types of optical modules 63. In one embodiment, the voltage for the fixed voltage source can be either about 2.2 V or about 2.3. V. In a further embodiment, transistor T1 can be omitted and op-amp 212 can be a power op-amp or other power device to drive the resistor divider 220 directly.

Figure 10B:
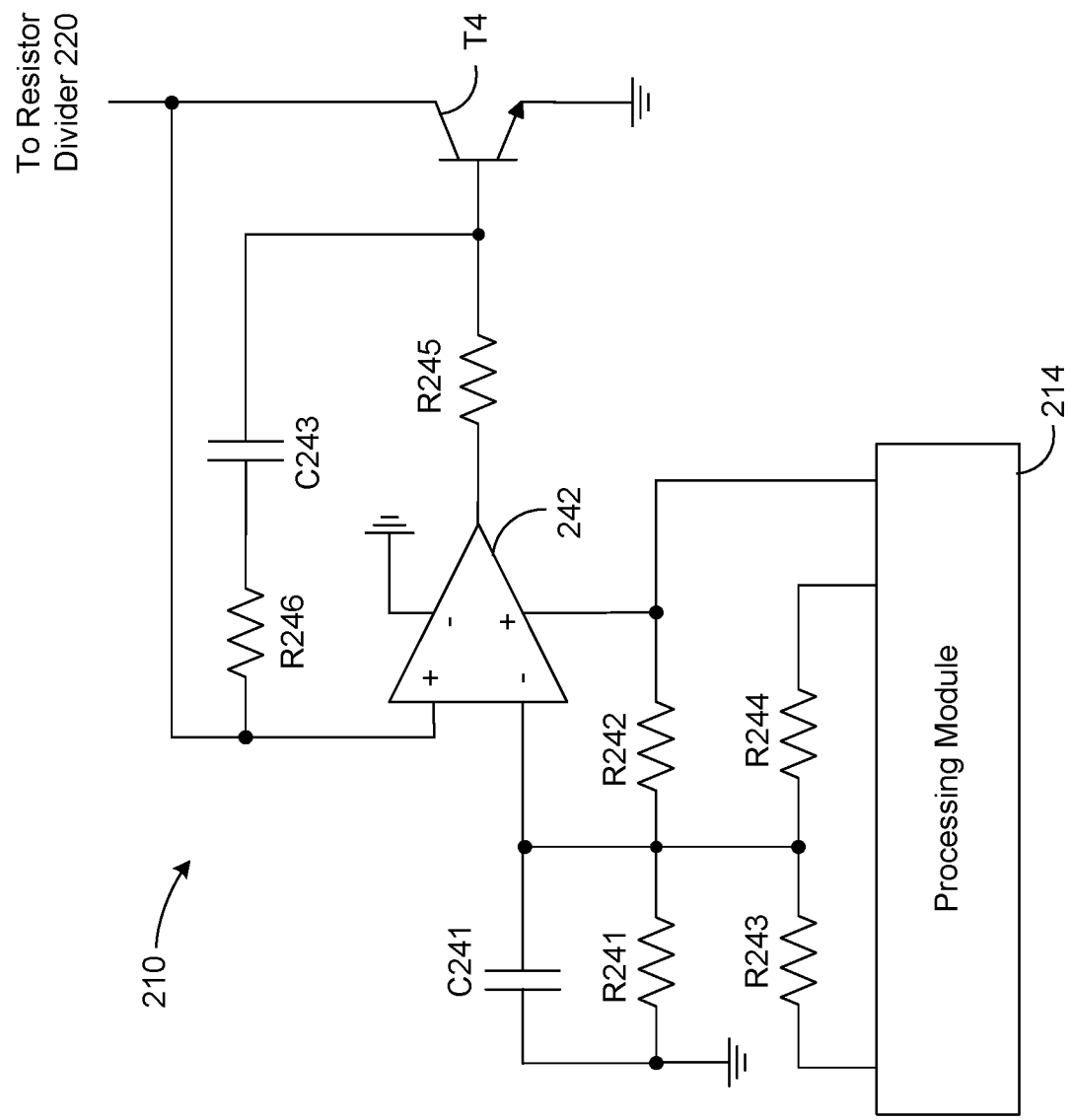

FIG. 10B is a circuit diagram showing another embodiment of the voltage adjustment circuit 210 to control the voltage level provided at the end of the resistor divider 220 opposite the connection to the differential signal from the optical transceiver 63. The voltage adjustment circuit 210 can include a transistor T4 controlled by an op-amp 242 that sets the voltage level that is pulled to by the resistor divider 220. The collector of transistor T4 can be connected to the resistor divider 220, the emitter of transistor T4 can be connected to ground, and the base of transistor T4 can be connected to the output of op-amp 242 through series resistor R245. In one embodiment, the transistor T4 can be a BJT (bipolar junction transistor), but the transistor T4 may be any suitable type of transistor in other embodiments. The non-inverting input to the op-amp 242 can be connected to the resistor divider 220 in parallel with the collector of transistor T1. A resistor R245 can be connected between the output of the op-amp 242 and the base of transistor T4. A feedback network can be connected between the base of transistor T4 and the non-inverting input of op-amp 242. The feedback network can include a capacitor C243 connected in series with resistor R246. In one embodiment, capacitor C243 can have a capacitance of about 22 nF, the resistor R245 can have a resistance of about 3 kΩ and the resistor R246 can have a resistance of about 1 kΩ, but capacitor C243 and resistors R245 and R246 may have different values in other embodiments.

The inverting input to the op-amp 242 can be connected to a resistor network receiving control inputs (e.g., voltage inputs (or bits)) from a processing module 214. The processing module 214 can include a field programmable gate array (FPGA) and/or other electrical components to provide the corresponding voltage inputs to the resistor network. The resistor network can provide an input voltage to the inverting input of the op-amp 242 based on the voltage inputs provided by the processing module 214. The processing module 214 can provide voltage inputs to the resistor network based on the type of optical receiver 63 being used. The resistor network can include a capacitor C241 connected between the inverting input of op-amp 242 and ground, a resistor R241 connected in parallel with capacitor C241, a resistor R242 connected between power supplied to the op-amp 242 by processing module 214 and the inverting input of op-amp 242, and a pair of resistors R243 and R244 each connected to the inverting input of op-amp 242 and control inputs from the processing module 214. Resistors R242, R243 and R244 can be connected to different terminals of the processing module 214 to receive different control (e.g., voltage) inputs from the processing module 214. For example, resistor R243 can be connected to a first control input of the processing module 214. The first control input may be set "high" (e.g., 3.3 V) such that the voltage level pulled to by the resistor divider 220 is "high" when the optical transceiver 63 includes a CML driver. In contrast, the first control input may be set "low" (e.g., 0 V) such that the voltage level pulled to by the resistor divider 220 is "low" when the optical transceiver 63 includes a LVPCL driver. In addition, resistor R244 can be connected to a second control input of the processing module 214. The second control input may be set "high" (e.g., 3.3 V) or "low" (e.g., 0 V) depending on one or more of the first control input, the driver of the optical transceiver 63 and the desired voltage to be pulled by the resistor divider 220. The second control input can be used as a "trim" to adjust for variances between different types of optical transceivers 63. In one embodiment, the capacitor C241 can have a capacitance of about 1 uF, the resistor R241 can have a resistance of about 20 kΩ, the resistor R242 can have a resistance of about 100 kΩ, the resistor R243 can have a resistance of about 10 kΩ, and the resistor R244 can have a resistance of about 100 kΩ, but the capacitor C241 and resistors R241, R242, R243 and R244 may have different values in other embodiments.

In an embodiment, the output of the op-amp 242 can be used to control the transistor T4. In another embodiment, the voltage adjustment circuit 210 can be replaced by a fixed voltage source that provides a fixed voltage to the end of the resistor divider 220 opposite the connection to the differential signal from the optical transceiver 63. The fixed voltage from the fixed voltage source can be selected to permit the coupling module 60 to operate with several different types of optical modules 63. In one embodiment, the voltage for the fixed voltage source can be either about 2.2 V or about 2.3. V.

Although the figures herein may show a specific order of method steps, the order of the steps may differ from what is depicted. Also, two or more steps may be performed concurrently or with partial concurrence. Variations in step performance can depend on the software and hardware systems chosen and on designer choice. All such variations are within the scope of the application. Software implementations could be accomplished with standard programming techniques, with rule based logic and other logic to accomplish the various connection steps, processing steps, comparison steps and decision steps.

The coupling module 60 is described in various embodiments for use within an OLT. However, it is possible to use the coupling module 60 in other types of communication devices, such as an ONU. As an example, an ONU may be configured according to the block diagram shown by FIG. 2 having a coupling module 60 that is coupled between and optical transceiver 63 and a processing module 69, as described above for the OLT 30.

Further, the use of the coupling module 60 is not limited to communication devices. In other embodiments, the coupling module 60 can be connected between an input module and an output module that require a level shift of the common mode voltage or the DC offset voltage in order for the modules to communicate. The coupling module 60 can adjust the common mode voltage or DC offset voltage of a signal received from the input module to enable the output module to process the signal.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A communication device comprising:
   a transceiver configured to provide a first differential signal carrying a data stream at an output connection, the first differential signal comprising a first positive differential signal and a first negative differential signal and having a first common mode voltage at the output connection, the transceiver having one of a first driver configuration or a second driver configuration;
   a processing module comprising an input connection to receive a second differential signal, the second differential signal comprising a second positive differential signal and a second negative differential signal and having a second common mode voltage, the second common mode voltage being different from the first common mode voltage;
   an adapter module connected to the transceiver and configured to provide an intermediate differential signal; and
   a coupling module connecting the adapter module and the processing module, the coupling module configured to receive the intermediate differential signal and provide the second differential signal to the processing module, wherein the intermediate differential signal is different from the second differential signal,
   wherein the adapter module includes a resistor divider connected to the transceiver to receive the first differential signal and a voltage source connected to the resistor divider, the voltage source configured to establish a voltage at an end of the resistor divider such that the coupling module is able to operate with the transceiver when the transceiver has either the first driver configuration or the second driver configuration.

2. The communication device of claim 1, wherein the voltage source comprises a voltage adjustment circuit configured to establish a first predetermined voltage at an end of the resistor divider based on the transceiver having the first driver configuration and a second predetermined voltage at the end of the resistor divider based on the transceiver having the second driver configuration.

3. The communication device of claim 2, wherein the processing module is a first processing module and the voltage adjustment circuit receives at least one control input from a second processing module, wherein the voltage adjustment circuit provides the first predetermined voltage or the second predetermined voltage based on the at least one control input.

4. The communication device of claim 3, wherein the voltage adjustment circuit comprises an operational amplifier, wherein the at least one control input from the second processing module is provided to an input to the operational amplifier via a resistor network.

5. The communication device of claim 4, wherein the resistor network is connected to one of a non-inverting input of the operational amplifier or an inverting input of the operational amplifier.

6. The communication device of claim 5, wherein the resistor network is connected to the non-inverting input of the operational amplifier and the inverting input of the operational amplifier is connected to the resistor divider.

7. The communication device of claim 5, wherein the resistor network is connected to the inverting input of the operational amplifier and the non-inverting input of the operational amplifier is connected to the resistor divider.

8. The communication device of claim 7, wherein the voltage adjustment circuit further comprises a transistor connected to an output of the operational amplifier.

9. The communication device of claim 1, wherein the resistor divider includes a first resistor and a second resistor connected in series and a third resistor and a fourth resistor connected in series, the first resistor and the second resistor are connected to the transceiver to receive the first positive differential signal and the third resistor and the fourth resistor are connected to the transceiver to receive the first negative differential signal.

10. The communication device of claim 9, wherein the intermediate differential signal includes a first intermediate positive differential signal, a second intermediate positive differential signal, a first intermediate negative differential signal and a second intermediate negative differential signal, the first intermediate positive differential signal corresponding to the first positive differential signal, the second intermediate positive differential signal corresponds to the first positive differential signal after passing through a portion of the resistor divider, the first intermediate negative differential signal corresponding to the first negative differential signal, the second intermediate negative differential signal corresponds to the first negative differential signal after passing through a portion of the resistor divider.

11. The communication device of claim 10, wherein the coupling module includes a high-pass filter for each of the first intermediate positive differential signal and the first intermediate negative differential signal and a low-pass filter for each of the second intermediate positive differential signal and the second intermediate negative differential signal.

12. A method of communicating high speed signals between an input module and an output module, the method comprising:
   receiving, by an adapter module, a first differential signal carrying a data stream from the input module, the first differential signal comprising a first positive differential signal and a first negative differential signal and having a first common mode voltage, the input module having one of a first driver configuration or a second driver configuration;
   generating, by the adapter module, an intermediate differential signal, the adapter module including a resistor divider connected to the input module and a voltage supply circuit, wherein generating the intermediate differential signal includes:
      receiving, by the voltage supply circuit, at least one control input from a processing module; and
      establishing a first predetermined voltage at an end of the resistor divider based on the at least one control input and the input module having the first driver configuration or establishing a second predetermined voltage at the end of the resistor divider based on the at least one control input and the input module having the second driver configuration;
   receiving, by a coupling module, the intermediate differential signal from the adapter module;
   generating, by the coupling module, a second differential signal, wherein the second differential signal is different from the intermediate differential signal; and providing the second differential signal to the output module, the second differential signal comprising a second positive differential signal and a second negative differential signal and having a second common mode voltage, the second common mode voltage being different from the first common mode voltage.

13. The method of claim 12, wherein the voltage supply circuit comprises an operational amplifier, and wherein generating the intermediate differential signal includes providing the at least one control input from the processing module to one of a non-inverting input of the operational amplifier or an inverting input of the operational amplifier.

14. A method of communicating high speed signals between an input module and an output module, the method comprising:
   receiving, by an adapter module, a first differential signal carrying a data stream from the input module, the first differential signal comprising a first positive differential signal and a first negative differential signal and having a first common mode voltage, the input module having one of a first driver configuration or a second driver configuration;
   generating, by the adapter module, an intermediate differential signal, the adapter module including a resistor divider connected to the input module and a voltage supply circuit, wherein generating the intermediate differential signal includes establishing a voltage at an end of the resistor divider for both the first driver configuration and the second driver configuration, wherein generating the intermediate differential signal includes generating a first intermediate positive differential signal, a second intermediate positive differential signal, a first intermediate negative differential signal and a second intermediate negative differential signal, the first intermediate positive differential signal corresponding to the first positive differential signal, the second intermediate positive differential signal corresponding to the first positive differential signal after passing through a portion of the resistor divider, the first intermediate negative differential signal corresponding to the first negative differential signal, the second intermediate negative differential signal corresponding to the first negative differential signal after passing through a portion of the resistor divider;
   receiving, by a coupling module, the intermediate differential signal from the adapter module;
   generating, by the coupling module, a second differential signal, wherein the second differential signal is different from the intermediate differential signal; and
   providing the second differential signal to the output module, the second differential signal comprising a second positive differential signal and a second negative differential signal and having a second common mode voltage, the second common mode voltage being different from the first common mode voltage.

15. An adapter module for a communication device, the adapter module comprising:
   an input connection configured to receive a first differential signal carrying a data stream from one of a first transceiver having a first driver configuration or a second transceiver having a second driver configuration, the input connection having a positive input terminal to receive a first positive differential signal of the first differential signal and a negative input terminal to receive a first negative differential signal of the first differential signal, and wherein the first driver configuration is different from the second driver configuration;
   a resistor divider connected to the input connection and having a plurality of resistors, the plurality of resistors comprising at least one first resistor connected to the positive input terminal and at least one second resistor connected to the negative input terminal;
   a voltage adjustment circuit connected to the resistor divider, the voltage adjustment circuit configured to establish a first predetermined voltage at the resistor divider upon the first transceiver being connected to the input connection or a second predetermined voltage at the end of the resistor divider upon the second transceiver being connected to the input connection, wherein the voltage adjustment circuit receives at least one control input from a processing module and provides either the first predetermined voltage or the second predetermined voltage based on the at least one control input; and
   an output connection configured to provide a second differential signal to a coupling module, wherein the second differential signal is different from the first differential signal.

16. The adapter module of claim 15, wherein the voltage adjustment circuit comprises an operational amplifier, and wherein the at least one control input from the processing module is provided to one of a non-inverting input of the operational amplifier or an inverting input of the operational amplifier.

17. An adapter module for a communication device, the adapter module comprising:
   an input connection configured to receive a first differential signal carrying a data stream from one of a first transceiver having a first driver configuration or a second transceiver having a second driver configuration, the input connection having a positive input terminal to receive a first positive differential signal of the first differential signal and a negative input terminal to receive a first negative differential signal of the first differential signal, and wherein the first driver configuration is different from the second driver configuration;
   a resistor divider connected to the input connection and having a plurality of resistors, the plurality of resistors comprising a pair of first resistors connected to the positive input terminal and a pair of second resistors connected to the negative input terminal;
   a voltage source connected to the resistor divider, the voltage source configured to establish a voltage at the resistor divider upon either the first transceiver or the second transceiver being connected to the input connection; and
   an output connection configured to provide a second differential signal to a coupling module, wherein the second differential signal is different from the first differential signal, wherein the output connection comprises a first positive output terminal, a second positive output terminal, a first negative output terminal and a second negative output terminal, the first positive output terminal connected to the positive input terminal, the first negative output terminal connected to the negative input terminal, the second positive output terminal connected between the pair of first resistors and the second negative output terminal connected between the pair of second resistors.

18. The adapter module of claim 17, wherein the voltage source comprises a fixed voltage source.

19. The adapter module of claim 17, wherein the voltage source establishes the same voltage at the resistor divider upon either the first transceiver or the second transceiver being connected to the input connection.

20. The adapter module of claim 17, wherein the first driver configuration is a current mode logic configuration and the second driver configuration is a low voltage positive emitter coupled logic configuration.

\* \* \* \* \*